(12) United States Patent
Louis et al.

(10) Patent No.: US 6,525,945 B1
(45) Date of Patent: Feb. 25, 2003

(54) METHOD AND SYSTEM FOR WIDE BAND DECOUPLING OF INTEGRATED CIRCUITS

(75) Inventors: Philippe Pierre Louis, Nice (FR); Patrick Michel, LaGaude (FR); Michel Paul Verhaeghe, Cagnes sur Mer (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/642,367

(22) Filed: Aug. 21, 2000

(30) Foreign Application Priority Data

Aug. 20, 1999 (EP) ............................................. 99480081

(51) Int. Cl.[7] ................................................. H05K 1/18
(52) U.S. Cl. ....................... 361/763; 361/760; 361/761; 361/790; 361/767; 361/803; 361/811; 361/764; 361/782; 361/766; 361/807
(58) Field of Search ................................ 361/790, 735, 361/763, 760, 761, 767, 764, 803, 782, 766, 748, 734, 807, 811, 821

(56) References Cited

U.S. PATENT DOCUMENTS

| | | | | | |
|---|---|---|---|---|---|
| 5,258,648 | A | * | 11/1993 | Lin ............................. | 257/778 |
| 5,798,567 | A | * | 8/1998 | Kelly et al. .................. | 257/723 |
| 6,255,899 | B1 | * | 7/2001 | Bertin et al. ................. | 327/564 |
| 6,278,264 | B1 | * | 8/2001 | Burstein et al. ............ | 323/282 |

* cited by examiner

*Primary Examiner*—David Martin
*Assistant Examiner*—Thanh Y. Tran
(74) *Attorney, Agent, or Firm*—Ira D. Blecker

(57) ABSTRACT

An eletronic package comprising a printed circuit board on which are mounted a plurality of decoupling capacitors is disclosed. A carrier component electrically connects an integrated circuit to the printed circuit board through a plurality of solder balls. The plurality of solder balls comprises at least one solder ball for the integrated circuit ground voltage connection and at least one solder ball for the integrated circuit power voltage connection. The plurality of decoupling capacitors is organized as a set of 'n' capacitors ranged from a lower capacitor value $C_{low}$ to a higher capacitor value $C_{high}$ such that the range $C_{low}$ to $C_{high}$ of the 'n' capacitor values is a function of the frequency range $F_{low}$ to $F_{high}$ on which the integrated circuit operates. The number of decoupling capacitors is determined according to the free area on the surface of the printed circuit board, and the value of each consecutive capacitor value is a function of the previous capacitor value according to a multiplying factor of $$R = K^{\frac{1}{n-1}}$$

where $$K = \left(\frac{F_{High}}{F_{Low}}\right)^2.$$

13 Claims, 4 Drawing Sheets

METHOD AND SYSTEM FOR WIDE BAND DECOUPLING OF INTEGRATED CIRCUITS

TECHNICAL FIELD

The invention relates to the field of decoupling capacitors for integrated circuits. More particularly, this invention relates to a capacitor arrangement suitable for wide band decoupling of a ball grid array module.

BACKGROUND ART

It is well known in the field of microelectronics that high frequency operation, particularly the switching of integrated circuits, can result in transient energy being coupled into the power supply circuit. Generally, the prevention of the coupling of undesired high frequency noise or interference into the power supply for an integrated circuit (IC) is accomplished by connecting one or more decoupling capacitors between the power and ground leads of the IC.

With the high complexity of nowadays ICs which offer a great number of input and output I/Os (up to 1,000 I/Os), it is mandatory that the I/Os be disposed in a matricial arrangement, such as the 1,024 I/Os matrix arranged as a 32 rows by 32 columns for the so-called Ball Grid Array (BGA) package. With such packaging, the distance between two adjacent balls is reduced to the order of half a millimeter such that it prevents the location of known decoupling components within such limited free area.

Hernandez et al. U.S. Pat. No. 5,422,782, the disclosure of which is incorporated by reference herein, discloses a decoupling capacitor comprising a plurality of capacitive elements arranged to form a single component which is mounted in an open area under an integrated circuit package. Such decoupling capacitor is not usable in the ball grid array structure which does not offer sufficient free space area. Moreover, the drawback of such assembled component is that the intrinsic inductance of each capacitive element is downgraded by the parasitic inductance of each corresponding conductor acting as a multi capacitive element lead.

One known scheme for decoupling in the BGA packages is to use one or more discrete capacitors which are mounted on a multilayer printed circuit board (PCB) around the integrated circuit. Plated through holes are then used to connect the capacitors to the internal power plane and ground plane, which in turn make contact with the power supply connection leads of the integrated circuit. In this connection scheme, the capacitors are mounted as close to the integrated circuit as possible to reduce the length of the trace connection paths between the capacitors plates and the IC power pins and ground pins. Indeed, trace paths have an inductance which is proportional to the paths length and that causes increased noise when the circuit is used in high speed environments. Kelly et al. U.S. Pat. No. 5,798,567, the disclosure of which is incorporated by reference herein, discloses a ball grid array integrated circuit package with power supply decoupling capacitors attached to the upper or the lower surface of the BGA directly in front of the integrated circuit in order to minimize the distance between a power supply balls of the integrated circuit and the decoupling capacitors. In this patent, various implementations of decoupling capacitors are shown mounted on a BGA. Even if these solutions provide an efficient decoupling in the high frequency regions, they require that the BGA package integrates the mounting of the decoupling capacitors which adds an overcost for the packaging.

The present invention solves the aforementioned problem at a minimum cost by mounting decoupling capacitors at the card level, i.e. on the printed circuit board.

Electronic theory recites that discrete capacitors are modeled by a parasitic inductance in series with a capacitance. Below the resonance frequency of the capacitor, the main active component is capacitive reactance while at resonance point it is equivalent series resistance, and above resonance point it is inductive reactance. Therefore, the decoupling function of a capacitor is optimum for a range of frequencies around the resonance frequency where the resulting impedance is the lowest. In order to improve the decoupling for a particular frequency region, several identical capacitors of the same value may be arranged in parallel such that the overall impedance at the resonance point can be lowered.

Recent complex integrated circuits for example such as microprocessors in the field of computers, or packet/cell switch circuits (e.g. Asynchronous Transfer Mode cell switch circuits) in the networking field, integrate on the same chip a plurality of logical functions which operate at different working frequencies. For example a networking switch circuit may include a microcontroller interface operating at 10 Mhz (Megahertz), a switch core operating at 100 Mhz, and a serializer/deserializer function operating at 400 Mhz and above.

Furthermore, due to the Fourier transform of the rising edge and the falling edge of switching signals such as clock signal (the highest frequency) or data signal, some "Fourier derived frequencies" provide undesirable additional noise. It is to be noted that such Fourier frequencies are at least five times the working frequencies.

Therefore, in the context of multi-frequencies circuits, an efficient decoupling technique should be capable of filtering a wide range of frequencies including the additional ones, e.g. from about 10 Mhz up to about 400 MHz as cited in the previous example.

A technique known in the art for decoupling an integrated circuit over a plurality of frequencies relies on using several capacitors having different capacitance values. The capacitance values generally range from a lower value to a higher value such as to provide at least a high and a low frequency filtering. However, this technique suffers from two major drawbacks. Firstly, there is always an uncertainty as to the value of the resonance frequency of commercially available discrete capacitors due to the inherent dispersion on the value of the intrinsic inductance associated with the discrete capacitor. This may lead to a value of the resonance frequency which is shifted compared to the desired frequency at which the integrated circuit must be decoupled, and thus resulting in a partly inefficient decoupling. Secondly, even if an appropriate choice of discrete capacitor gives a substantially efficicent decoupling around the discrete working frequencies of the integrated circuit, the decoupling is generally not operative over a wide range of frequencies and particularly not operative for the high frequency values caused by the above-defined "Fourier derived frequencies" as it is the case for the aforementioned patents.

Therefore, in the context of complex integrated circuits having multiple working frequencies, there is a need for a low cost decoupling technique that provides an efficient decoupling of such integrated circuits over a wide range of frequencies.

BRIEF SUMMARY OF THE INVENTION

The object of the invention is therefore to provide a decoupling method and system that addresses the foregoing need in order to solve the deficiencies of the prior art. This object is met in accordance with the invention in which an electronic package comprising a printed circuit board on which are mounted a plurality of decoupling capacitors is claimed. A carrier component electrically connects an integrated circuit to the printed circuit board through a plurality of solder balls. The plurality of solder balls comprises at least one solder ball for the integrated circuit ground voltage connection and at least one solder ball for the integrated circuit power voltage connection. The plurality of decoupling capacitors is organized as a set of "n" capacitors ranged from a lower capacitor value "$C_{low}$" to a higher capacitor value "$C_{high}$" such that the range $C_{low}$ to $C_{high}$ of the "n" capacitor values is a function of the frequency range $F_{low}$ to $F_{high}$ on which the integrated circuit operates.

In an embodiment, each consecutive capacitor value is a function of the previous capacitor value according to a multiplying factor of $$R = K^{\frac{1}{n-1}}$$

where $$K = \left(\frac{F_{High}}{F_{Low}}\right)^2.$$

In one aspect, the method of suppressing noise in the electronic package comprises the steps of:
  providing a set of "n" decoupling capacitors according to the free area on the surface of the printed circuit board;
  determining "n" capacitor values $C_{low}$ to $C_{high}$ for the set of the "n" decoupling capacitors according to the operating frequency range $F_{low}$ to $F_{high}$ of the integrated circuit;
  mounting the set of "n" decoupling capacitors on the printed circuit board; and
  electrically connecting each end terminal of each decoupling capacitor to the ground voltage solder ball and to the power supply voltage solder ball.

BRIEF DESCRIPTION OF THE DRAWINGS

An embodiment of the invention will now be described, by way of example only, with reference to the accompanying drawings, wherein:

FIG. 1-b shows a typical impedance magnitude curve vs frequency;

FIG. 4-b shows compared impedance magnitude curves vs frequency for the arrangement of FIG. 1-a and of FIG. 4-a.

DETAILED DESCRIPTION OF THE INVENTION

Figure 1A:
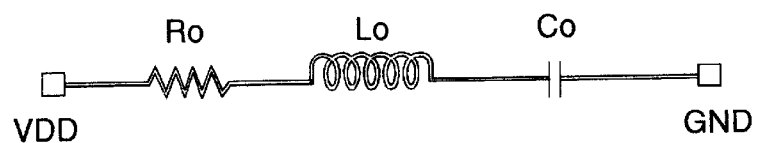
FIG. 1-a shows the electrical equivalent circuit of a typical discrete capacitor.
Figure 1B:
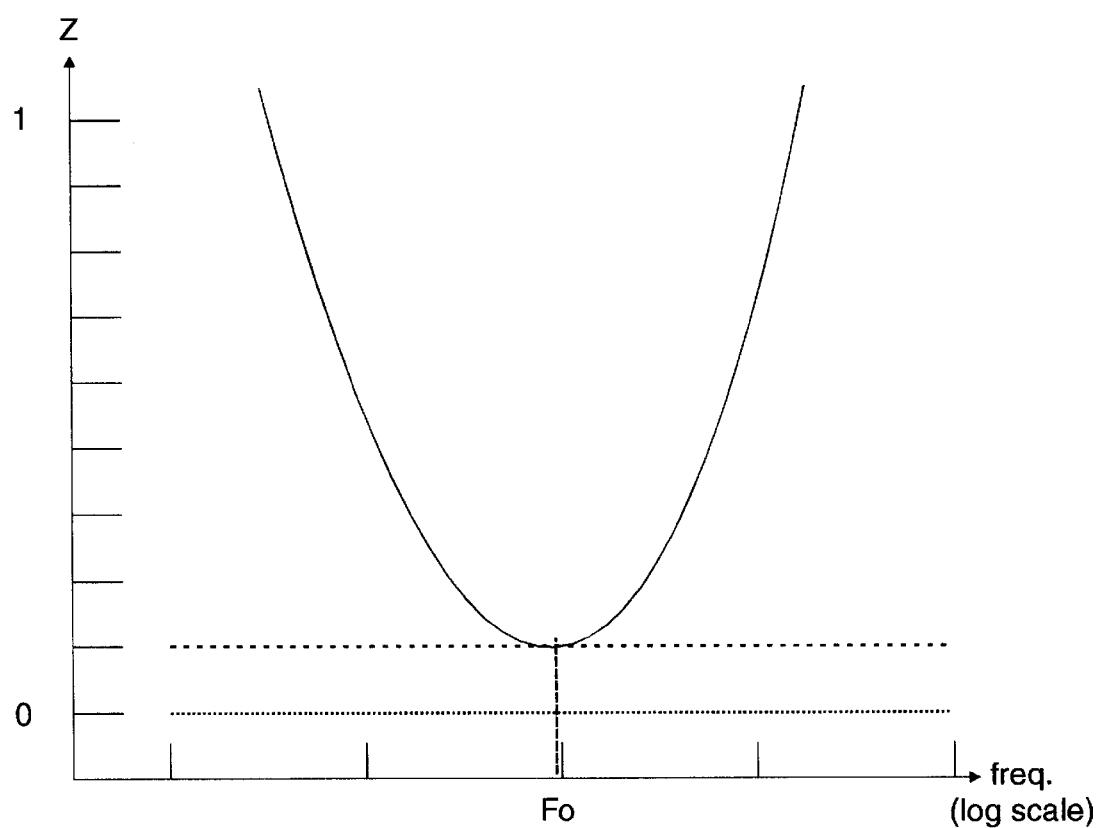
Figure 4A:
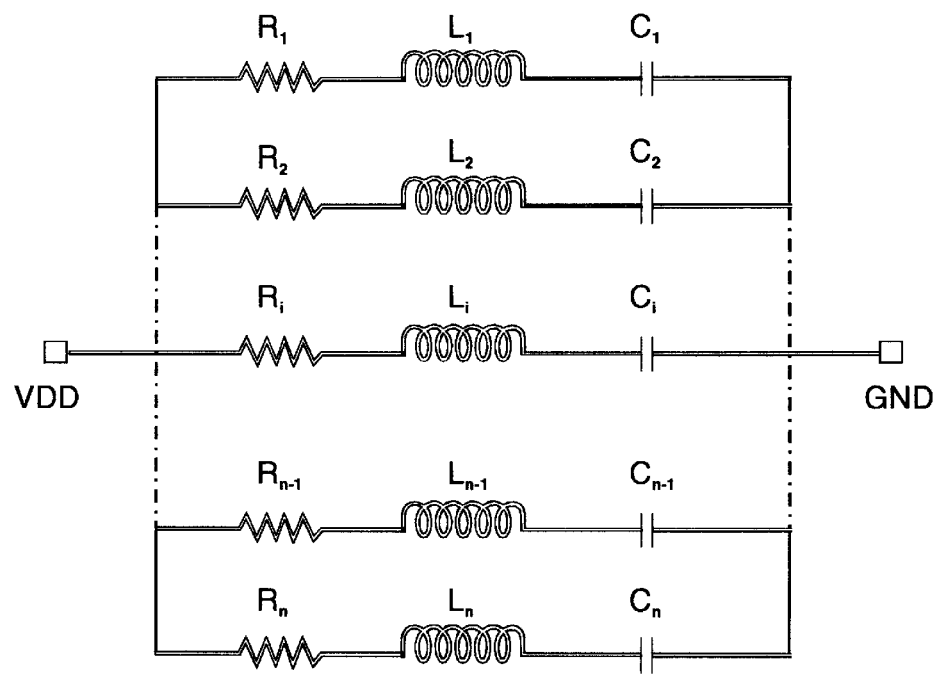
FIG. 4-a shows the electrical equivalent circuit of the decoupling arrangement of the invention.
Figure 4B:
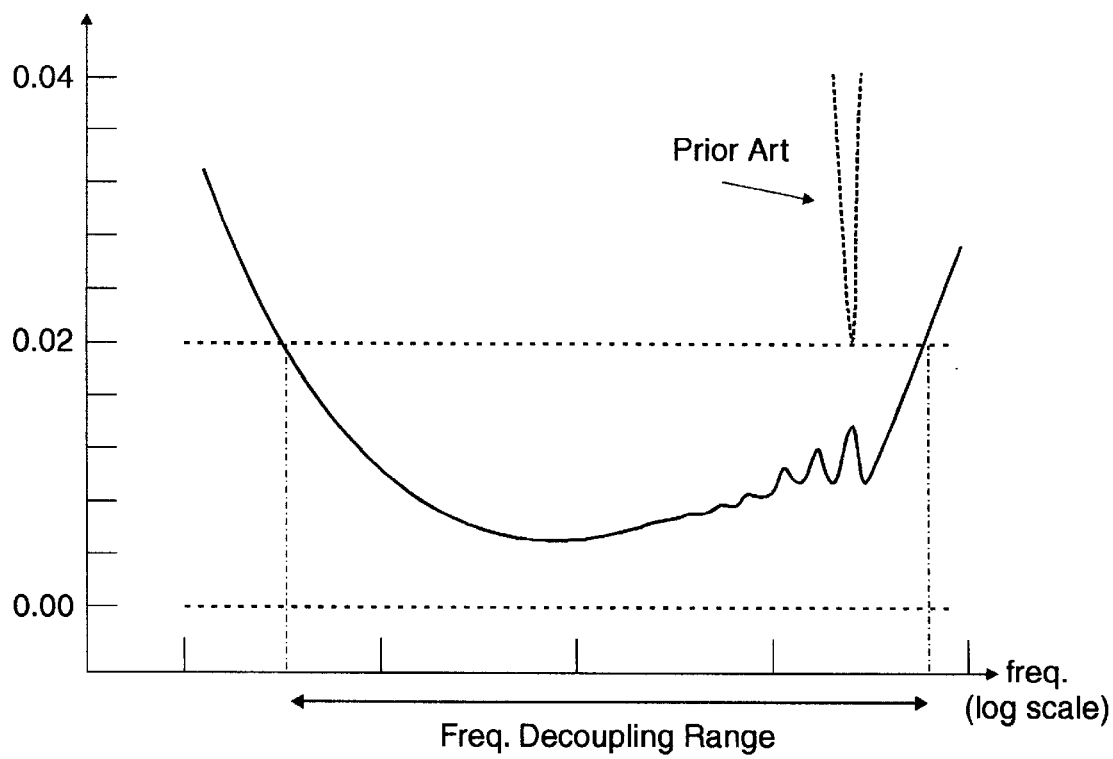

Referring now to FIG. 1-a and FIG. 1-b, the electrical equivalent circuit of a typical discrete capacitor is shown on FIG. 1-a and the corresponding impedance magnitude versus frequency characteristic is shown on FIG. 1-b. It is well known in the art that the total impedance "Z" of a capacitor "C" is composed of three series elements, i.e. a resistive one "Ro", an inductive one "Lo" and a capacitive one "Co". As already stated according to the area of operating, one of these series elements is the major component of the impedance. Particularly, at the resonance point the impedance magnitude is minimum and limited to the resistive part which is given by the general equation (1):

$$Fo = \frac{1}{2\pi\sqrt{LoCo}}, \qquad (1)$$

where Fo is the resonance frequency. This phenomenon is illustrated on FIG. 1-b where the vertical units are not to be interpreted as real impedance value but only as reference units for further comparison with the invention (FIG. 4-b).

It is known by the skilled person that the efficiency of a capacitor for suppressing noise is limited to a narrow frequency range around Fo. The already cited U.S. Pat. No. 5,422,782 describes a system to enlarge the frequency range by associating several capacitors in parallel. However this solution only extends this area to the lower harmonics of the integrated circuit clock frequency.

Figure 2:
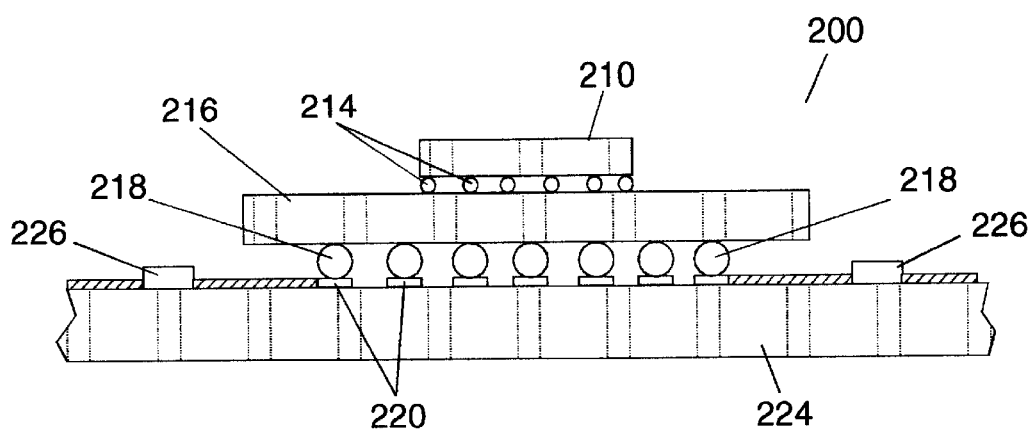
FIG. 2 is a partial cross-sectional view of a PCB including the decoupling capacitors of the invention.

FIG. 2 shows a partial cross-sectional view of a ball grid array 200 including the decoupling capacitors of the invention. The package 200 includes an integrated circuit IC chip 210 with solder balls 214 formed upon or otherwise applied to the active surface of IC chip 210. The chip is inverted to form or apply the solder balls 214 and turned back over to connect the chip 210 to a ceramic component carrier 216. The ceramic chip carrier 216 contains a number of conductive pathways (not shown) which connect the solder balls 214 on the chip 210 to solder balls 218 on the bottom of the ceramic carrier 216. The solder balls 218 on the ceramic carriers 216 are bonded to conductive contacts 220 on a printed circuit board (PCB), shown schematically as 224. It is to be noted that the IC 210 could be as well connected to the ceramic carrier 216 by wire bonds instead of solder balls 214 without departing from the spirit of the invention.

Decoupling capacitors 226 are led on the upper face of the PCB 224 outside the area of solder balls 218. Each decoupling capacitor 226 is electrically connected by well known conductive pathways to a ground ball 218 and a voltage ball (not shown).

Figure 3:
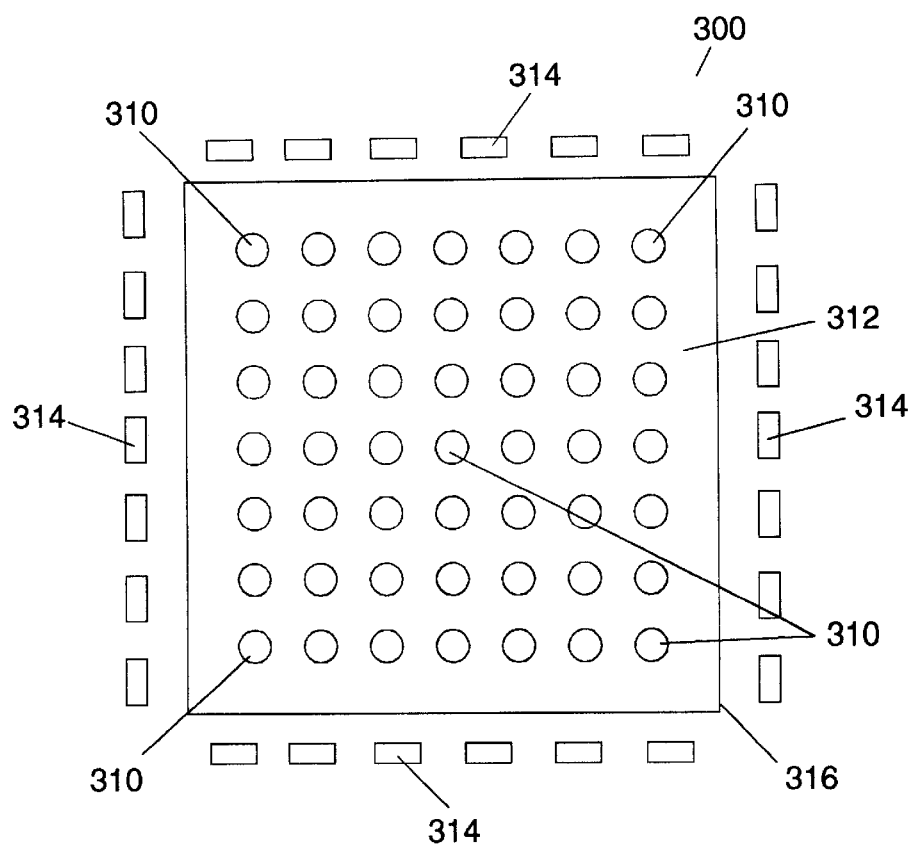
FIG. 3 is an isometric view of an electronic package including the decoupling arrangement of the invention.

FIG. 3 shows an elevation schematic view of a BGA 300 embodying the invention. The package comprises a plurality of balls 310 for connecting the ceramic 312 to the PCB (not shown). For example, a typical BGA package is a 25×25 I/O's comprising 625 balls spaced by 50 mils. The available area between neighbor balls is in the range of 20 mils which does not allow the placement of any other component therein. Decoupling capacitors 314 are located around the module 316 boundary in a crown shape, either on the upper face or on the lower face of the PCB. In the preferred embodiment the capacitors are regularly disposed on the four edges of the module and are regularly spaced.

In an alternative, decoupling capacitors are disposed on both faces of the PCB. Other arrangements may be devised to increase the number of decoupling capacitors such as a double crown around the module.

FIG. 4-a shows the equivalent electrical circuit of the arrangement of 'n' decoupling capacitors of the present invention. The "n" decoupling capacitors are parallel connected between power supply VDD and ground GND. Each capacitor is represented by a three series elements (Ri,Li,Ci) as explained previously, but for simplification of the description, it is assumed that the value of the parasitic series resistances Ri are all equal to "Rp", as well as the value of the parasitic series inductances Li are all equal to "Lp".

In the context of an application requiring that the integrated circuit operates within a frequency range between a lower frequency $F_{low}$ and a higher frequency $F_{high}$, the decoupling must be effective over the whole range. To determine the number 'n' of decoupling capacitors and associated values to cover the whole range of frequencies, the first parameter is to determine the free available area 'Sa' on the surface of the PCB once the design constraints specified by the application have been incorporated. The free area may be either on the upper face or on the lower face of the PCB or on both faces.

Once the total number "n" of possibly mounted decoupling capacitors is fixed, the next step is to determine the lower $C_{low}$ and the higher $C_{high}$ values for the "n" decoupling capacitors. The value of the lower capacitance $C_{low}$ is derived from equation (1) for its series resonance at the higher frequency $F_{high}$:

$$C_{Low} = \frac{1}{4\pi^2 L p F_{high}^2}, \quad (2)$$

wherein "Lp" is the value of the parasitic inductance. Similarly, the value of the higher capacitance $C_{high}$ is derived from equation (1) for its series resonance at the lower frequency $F_{low}$:

$$C_{high} = \frac{1}{4\pi^2 L p F_{low}^2}. \quad (3)$$

The intermediate decoupling values are determined to form a numerical series in which the next capacitance value is obtained by multiplying the previous capacitance value by a predetermined factor "R" with "R" being equal to:

$$R = K^{\frac{1}{n-1}} \quad (4)$$

where $$K = \left(\frac{F_{high}}{F_{low}}\right)^2 \quad (5)$$

In the previous example wherein the BGA module is sized as a 25 per 25 balls, a maximum of n=26 decoupling capacitors may be retained for each face of the PCB. If the integrated circuit is of the type dual functionality such as having send and receive parts, the 26 decoupling capacitors may be split into two subsets of 13 decoupling capacitors. To exemplify, if such circuit is operative between 16 MHz and 160 MHz, each set of 13 decoupling capacitors is ranged as follows from lower capacitor to higher capacitor by application of equations (2) to (5), with Rp=0.1 ohm and Lp=1 nH:

| Decoupling Capacitor value | | |
|---|---|---|
| Clow | = | 1.0 nF |
| C2 | = | 1.5 nF |
| C3 | = | 2.2 nF |
| C4 | = | 3.3 nF |
| C5 | = | 4.7 nF |
| C6 | = | 6.8 nF |
| C7 | = | 10 nF |
| C8 | = | 15 nF |

| -continued | | |
|---|---|---|
| Decoupling Capacitor value | | |
| C9 | = | 22 nF |
| C10 | = | 33 nF |
| C11 | = | 47 nF |
| C12 | = | 68 nF |
| Chigh | = | 100 nF |

In application, the set of capacitors are choosen among available discrete components provided by capacitor manufacturers such as AVX-KYOCERA.

The advantage of the invention is that once the values of the decoupling capacitors are determined, the location of each capacitor on the free available room on the PCB may be adapted to the requirement of the application and the capacitors may be located close to the more appropriate functional area.

Furthermore, the invention is operative for applications requiring several voltage supplies (2.5 V–3.3 V–5 V) by dedicating an appropriate subset of decoupling capacitors to each voltage supply. Each subset is composed of a number of decoupling capacitors to be effective for the respective range of frequency.

Referring now to FIG. 4-b, impedance magnitude curves vs frequency for the arrangement of FIG. 1-a and of FIG. 4-a are compared. The skilled person will readily understand that the capacitor arrangement of the invention greatly improves over the prior art systems both by extending the decoupling action over a wide range of frequencies and by lowering the minimum impedance value as it is illustrated by the vertical unit of 0.04 as compared to the vertical unit of 1.0 on vertical axis of FIG. 1.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An electronic package (200) comprising:

a printed circuit board (224);

an integrated circuit (210) operating over a frequency range $F_{low}$ to $F_{high}$;

a carrier component (216) to electrically connect the printed circuit board (224) to the integrated circuit. (210) through a plurality of solder balls (218), the plurality of solder balls comprising at least one ground voltage solder ball and at least one power voltage solder ball; and a plurality of decoupling capacitors (226) mounted on the printed circuit board and electrically connected to the at least one ground voltage solder ball and to the at least one power voltage solder ball wherein the plurality of decoupling capacitors (226) range from a lower capacitor value $C_{low}$ to a higher capacitor value $C_{high}$ such that the range $C_{low}$ to $C_{high}$ of the capacitor values is a function of the frequency range $F_{low}$ to $F_{high}$ of the integrated circuit (210), wherein the lower capacitor value is equal to $$C_{Low} = \frac{1}{4\pi^2 L p F_{high}^2},$$

wherein $L_p$ is the parasitic inductance of said lower capacitor; and wherein the higher capacitor value is equal to $$C_{high} = \frac{1}{4\pi^2 L p F_{low}^2},$$

wherein $L_p$ is the parasitic inductance of said higher capacitor.

2. The electronic package (200) of claim 1 wherein each consecutive capacitor value is a function of the previous capacitor value according to a multiplying factor of $$R = K^{\frac{1}{n-1}}$$

where $$K = \left(\frac{F_{High}}{F_{Low}}\right)^2,$$

wherein n is equal to the number of the plurality of decoupling capacitors.

3. The electronic package (200) of claim 1 wherein the plurality of decoupling capacitors is determined according to the free area on the printed circuit board (224).

4. The electronic package (200) of claim 1 wherein the plurality of decoupling capacitors is arranged around the boundary of the carrier component (216).

5. The electronic package (200) of claim 1 wherein the plurality of decoupling capacitors is mounted on the upper face of the printed circuit board (224).

6. The electronic package (200) of claim 1 wherein the plurality of decoupling capacitors is mounted on the lower face of the printed circuit board (224).

7. The electronic package (200) of claim 1 wherein the plurality of decoupling capacitors comprises a first subset of decoupling capacitors to decouple over a first range of frequencies and at least a second subset of decoupling capacitors to decouple over a second range of frequencies.

8. The electronic package (200) of claim 1 wherein the plurality of solder balls (218) comprises a first power voltage solder ball for connection to a first set of decoupling capacitors and at least a second power voltage solder ball for connection to a second set of decoupling capacitors.

9. The electronic package (200) of claim 8 wherein said first power voltage solder ball is electrically connected to a 5 Volts power supply, and said at least second power voltage solder ball is electrically connected to a 3.3 Volts power supply and further comprising a third power voltage solder ball electrically connected to a 2.5 Volts power supply.

10. The electronic package (200) of claim 1 wherein the plurality of solder balls (218) are organized as a ball grid array.

11. A method of suppressing noise in an electronic package comprising a printed circuit board (224), an integrated circuit (210) operating over a frequency range $F_{low}$ to $F_{high}$, a carrier component (216) to electrically connect the printed circuit board (224) to the integrated circuit (210) through a plurality of solder balls (218), the plurality of solder balls comprising at least one ground voltage solder ball and at least one power voltage solder ball, said method comprising the steps of:

providing a set of decoupling capacitors (226) according to the free area of the printed circuit board (224);

determining capacitor values $C_{low}$ to $C_{high}$ for the set of decoupling capacitors (216) according to an operating frequency range $F_{low}$ to $F_{high}$ of the integrated circuit (210);

mounting the set of decoupling capacitors on the printed circuit board (224); and electrically connecting each decoupling capacitor to the at least one ground voltage solder ball and to the at least one power supply voltage solder ball, wherein the lower capacitor value is equal to $$C_{Low} = \frac{1}{4\pi^2 L p F_{high}^2},$$

wherein $L_p$ is the parasitic inductance of said lower capacitor; and wherein the higher capacitor value is equal to $$C_{high} = \frac{1}{4\pi^2 L p F_{low}^2},$$

wherein $L_p$ is the parasitic inductance of said higher capacitor.

12. The method of claim 11 wherein the step of determining the capacitor values comprises the step of computing each consecutive capacitor value as being a function of the previous capacitor value according to a multiplying factor of $$R = K^{\frac{1}{n-1}}$$

where $$K = \left(\frac{F_{High}}{F_{Low}}\right)^2,$$

wherein n is equal to the number of the set of decoupling capacitators.

13. The method of claim 11 wherein the step of mounting said set of decoupling capacitors comprises the steps of:

mounting a first subset of the decoupling capacitors on the upper face of the printed circuit board; and mounting a second subset of the decoupling capacitors on the lower face of the printed circuit board.

* * * * *